US012622270B2

(12) United States Patent
Watanabe et al.

(10) Patent No.: US 12,622,270 B2
(45) Date of Patent: May 5, 2026

(54) HEAT RADIATING STRUCTURE AND ELECTRONIC APPARATUS

(71) Applicant: LENOVO (SINGAPORE) PTE. LTD., Singapore (SG)

(72) Inventors: Ryota Watanabe, Yokohama (JP); Junki Hashiba, Yokohama (JP); Masahiro Kitamura, Yokohama (JP); Takuroh Kamimura, Yokohama (JP)

(73) Assignee: LENOVO (SINGAPORE) PTE. LTD., Singapore (SG)

( * ) Notice: Subject to any disclaimer, the term of this patent is extended or adjusted under 35 U.S.C. 154(b) by 401 days.

(21) Appl. No.: 18/332,816

(22) Filed: Jun. 12, 2023

(65) Prior Publication Data

US 2024/0014098 A1     Jan. 11, 2024

(30) Foreign Application Priority Data

Jul. 5, 2022    (JP) ................................. 2022-108640

(51) Int. Cl.
  *H10W 40/25*        (2026.01)
  *G06F 1/20*         (2006.01)
(52) U.S. Cl.
  CPC ............ *H10W 40/257* (2026.01); *G06F 1/20* (2013.01)
(58) Field of Classification Search
  None
  See application file for complete search history.

(56) References Cited

U.S. PATENT DOCUMENTS

| | | | | |
|---|---|---|---|---|
| 2005/0068739 A1* | 3/2005 | Arvelo | ................ | H01L 23/3675 |
| | | | | 257/E23.09 |
| 2006/0157223 A1 | 7/2006 | Gelorme et al. | | |
| 2012/0280382 A1* | 11/2012 | Im | .......................... | H01L 23/36 |
| | | | | 257/E23.11 |
| 2014/0247560 A1* | 9/2014 | Lemberg | ................ | H02K 11/33 |
| | | | | 361/705 |

(Continued)

FOREIGN PATENT DOCUMENTS

| | | |
|---|---|---|
| EP | 2390913 A2 | 11/2011 |
| JP | 55-048953 A | 4/1980 |

(Continued)

OTHER PUBLICATIONS

EP search report, dated Dec. 11, 2023, in application No. 23176804.5-1211.

*Primary Examiner* — Bilkis Jahan
(74) *Attorney, Agent, or Firm* — SHIMOKAJI IP

(57)        ABSTRACT

A heat radiating structure includes a mesh which abuts on a surface of a die of a GPU and a copper plate which is equipped with a recessed part into which the mesh fits and which sandwiches and holds the mesh together with the surface of the die. The mesh includes a heat generating element abutment range part into which a liquid metal is impregnated and which abuts on the surface of the die and receives heat from the die and a heat generating element non-abutment region part which is contiguous to the heat generating element abutment range part and does not abut on the surface of the die. The heat generating element non-abutment range part is fixed to the copper plate with the use of a sponge tape. The heat generating element abutment range part is shaped to protrude from the heat generating element abutment range part.

7 Claims, 6 Drawing Sheets

(56) References Cited

U.S. PATENT DOCUMENTS

| | | | | |
|---|---|---|---|---|
| 2014/0264799 | A1* | 9/2014 | Gowda | H01L 23/4334 |
| | | | | 438/122 |
| 2015/0048922 | A1* | 2/2015 | Kimura | H01M 50/581 |
| | | | | 337/401 |
| 2019/0393118 | A1* | 12/2019 | Rawlings | H10W 40/22 |
| 2021/0195798 | A1 | 6/2021 | Nicholas | |
| 2023/0253288 | A1* | 8/2023 | Adebiyi | H01L 25/0655 |
| | | | | 257/687 |

FOREIGN PATENT DOCUMENTS

| | | | |
|---|---|---|---|
| JP | 2003332505 | A | 11/2003 |
| JP | 2004146819 | A | 5/2004 |
| JP | 2019079914 | A | 5/2019 |
| WO | 9423450 | A1 | 10/1994 |

* cited by examiner

HEAT RADIATING STRUCTURE AND ELECTRONIC APPARATUS

BACKGROUND OF THE INVENTION

Field of the Invention

The present invention relates to a heat radiating structure of an electric component which generates heat and an electronic apparatus which is equipped with the heat radiating structure.

Description of the Related Art

Semiconductor chips such as a GPU (Graphics Processing Unit), a CPU (Central Processing Unit) and so forth are installed on a portable information apparatus such as a laptop PC and so forth. Each of the GPU and the CPU is in the form of having a substrate which is adapted to mount each of the GPU and the CPU on a baseplate and a rectangular die which is installed on the surface of the substrate. In addition, there are cases where a small capacitor is installed on the surface of the substrate around the die.

The semiconductor chips such as the GPU, the CPU and so forth are heat generating elements and it is preferable to radiate heat from the GPU, the CPU and so forth depending on consumption power levels (in particular, when high loads are imposed thereon) of the GPU, the CPU and so forth. There are cases where a heat radiating element such as a vapor chamber, a heat spreader, a heat sink or the like is used as an element which radiates heat from the GPU, the CPU and so forth and heat is diffused by bringing the GPU, the CPU and so forth into abutment on the surface of the die via the heat radiating element such as the heat spreader, the heat sink or the like. There are cases where a fluid such as a liquid metal, a heat transfer grease and so forth is interposed between the die and the heat radiating element in order to efficiently transfer heat (see, for example, Japanese Unexamined Patent Application Publication No. 2004-146819).

SUMMARY OF THE INVENTION

The liquid metal is higher than the heat transfer grease in heat transfer property and makes it possible to transfer heat from the die to the heat radiating element effectively. On the other hand, the liquid metal has such a characteristic that it is higher than the heat transfer grease in fluidity. In a case where a user moves while carrying the electronic apparatus with him/her, the electronic apparatus is susceptible to vibrations and shocks. As a result, it is feared that the liquid metal which has fluidity would leak out through a gap between the die and the heat radiating element under the influence of the force which is repetitively exerted from the die and the heat radiating element.

There are cases where the liquid metal contains gallium as a main component and therefore the liquid metal would chemically react with copper and solder. In addition, since the liquid metal is electrically conductive and therefore induces short circuits in a case where the liquid metal leaks out and comes into contact with peripheral electric elements such as a capacitor and so forth, it is preferable to take some sort of countermeasures. As the countermeasures to be taken, for example, it is conceivable to install an insulation wall between an electric element and the die which are installed on the substrate. However, in a case where the electric element and the die are installed close to each other, a space for installing the insulation wall is not secured. In addition, it is feared that the amount of the liquid metal which is retained between the die and the heat radiating element would be reduced due to leakage and the heat transfer performance would be degraded.

Accordingly, the inventors of the present patent application consider to install a porous material such as a mesh and so forth into which the liquid metal is impregnated between the heat generating element such as the semiconductor chip and so forth and the heat radiating element such as the vapor chamber and so forth and to sandwich and hold the porous material between the heat generating element and the heat radiating element. The liquid metal which is impregnated into the mesh almost never leaks out and is maintained in the mesh. On the other hand, in a case where the porous material is sandwiched and held between the heat generating element and the heat radiating element with the aid of appropriate pressing force, misregistration almost never occurs. However, it is desirable that the porous material be fixed more accurately.

The present invention has been made in view of the above-mentioned issues and aims to provide a heat radiating structure and an electronic apparatus which make it possible to prevent the degradation of the performance of heat transfer between an electric component which generates heat and the heat radiating element and to more prevent the misregistration of the porous material.

In order to solve the above-mentioned issues and to attain the objects, a heat radiating structure according to a first aspect of the present invention is the heat radiating structure which is used for an electric component which generates heat and which includes a porous material which abuts on a surface of the electric component and a heat radiating element which includes a recessed part into which the porous material fits and sandwiches and holds the porous material between the heat radiating element itself and a surface of the electric component, in which the porous material includes a heat generating element abutment range part into which a heat transfer fluid is impregnated and which abuts on the surface of the electric component and receives heat from the electric component and a heat generating element non-abutment range part which is formed in a state of being contiguous to the heat generating element abutment range part and does not abut on the surface of the electric component, and the heat generating element non-abutment range part is fixedly adhered to the heat radiating element with a belt-shaped adhesive material.

An electronic apparatus according to a second aspect of the present invention is the electronic apparatus which has the heat radiating structure and which includes an electric component which generates heat, a porous material which abuts on a surface of the electric component and a heat radiating element which includes a recessed part into which the porous material fits and sandwiches and holds the porous material between the heat radiating element itself and a surface of the electric component, in which the porous material includes a heat generating element abutment range part into which a heat transfer fluid is impregnated and which abuts on the surface of the electric component and receives heat from the electric component, and a heat generating element non-abutment range part which is formed in a state of being contiguous to the heat generating element abutment range part and does not abut on the surface of the electric component, and the heat generating element non-abutment range part is fixedly adhered to the heat radiating element with a belt-shaped adhesive material.

According to the above-mentioned aspects of the present invention, since the heat transfer fluid is impregnated into the porous material and is held in the porous material, it becomes possible to prevent leakage of the heat transfer fluid and to prevent the degradation of the performance of heat transfer between the electric component which generates heat and the heat radiating element. In addition, since the porous material fits into the recessed part and the heat generating element non-abutment range part is fixedly adhered to the heat radiating element with the belt-shaped adhesive material, it becomes possible to prevent the mis-registration of the porous material.

DETAILED DESCRIPTION OF THE INVENTION

In the following, the embodiments of a heat radiating structure and an electronic apparatus pertaining to the present invention will be described in detail on the basis of the drawings. Incidentally, the present invention is not limited by these embodiments.

Figure 1:
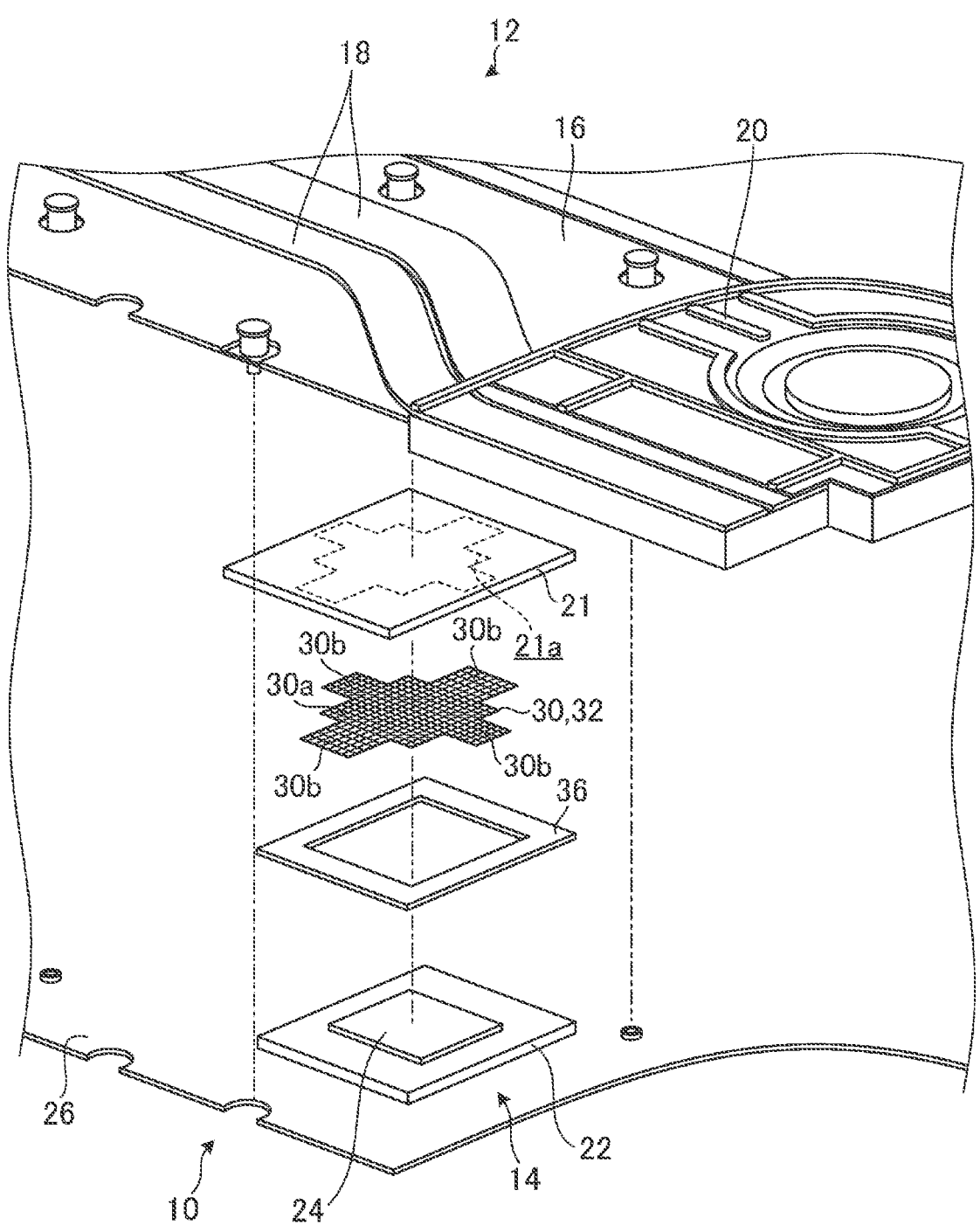
FIG. 1 is an exploded perspective view partially illustrating one example of a heat radiating structure and a portable information apparatus according to embodiments of the present invention.

FIG. 1 is an exploded perspective view partially illustrating one example of a heat radiating structure 10 and a portable information apparatus (an electronic apparatus) 12 according to the embodiments of the present invention.

The portable information apparatus 12 is, for example, a laptop PC, a tablet terminal, a smartphone or the like and includes a GPU 14. Although the heat radiating structure 10 is favorably used for the portable information apparatus 12, it is also possible to apply the heat radiating structure 10 to an electronic apparatus such as a stationary desktop computer and so forth. The GPU 14 is a semiconductor chip by which execution of real-time image processing becomes possible. Since the GPU 14 executes high-speed arithmetic operations and therefore generates heat of the amount which is commensurate with execution of the high-speed arithmetic operations, heat radiation becomes preferable. The portable information apparatus 12 includes a vapor chamber (a heat radiating element) 16 as a heat radiating unit for the GPU 14.

The vapor chamber 16 is a plate-shaped chamber that peripheral edges of two metal plates (for example, copper plates) are so joined together as to form a closed space in the inside and makes it possible to diffuse heat highly efficiently with the aid of phase change of a working fluid which is encapsulated into the closed space. A wick which sends the working fluid which is in a condensed state with the aid of the capillary phenomenon is installed in the closed space in the vapor chamber 16.

Two heat pipes 18 which are almost parallel with each other are installed in the vapor chamber 16 and further ends of the heat pipes 18 are connected to a fan 20. The heat pipe 18 is of the type that the working fluid is encapsulated into a closed space which is formed in a thin and flattened metal pipe and a wick is installed similarly to the vapor chamber 16. In addition, a copper plate 21 which serves as a heat-receiving plate is installed between the vapor chamber 16 and the GPU 14. It is possible to regard the copper plate 21 as a heat radiating element which is substantially integral with the vapor chamber 16.

As elements for radiating heat which is generated from the heat generating elements such as the GPU 14 and so forth, various kinds of heat radiating elements are applicable other than the vapor chamber 16. As the heat radiating elements, for example, metal plates which are made of metals which are high in thermal conductivity such as copper, aluminum and so forth, a graphite plate, a heat lane, a heat sink and so forth are given.

Figure 2:
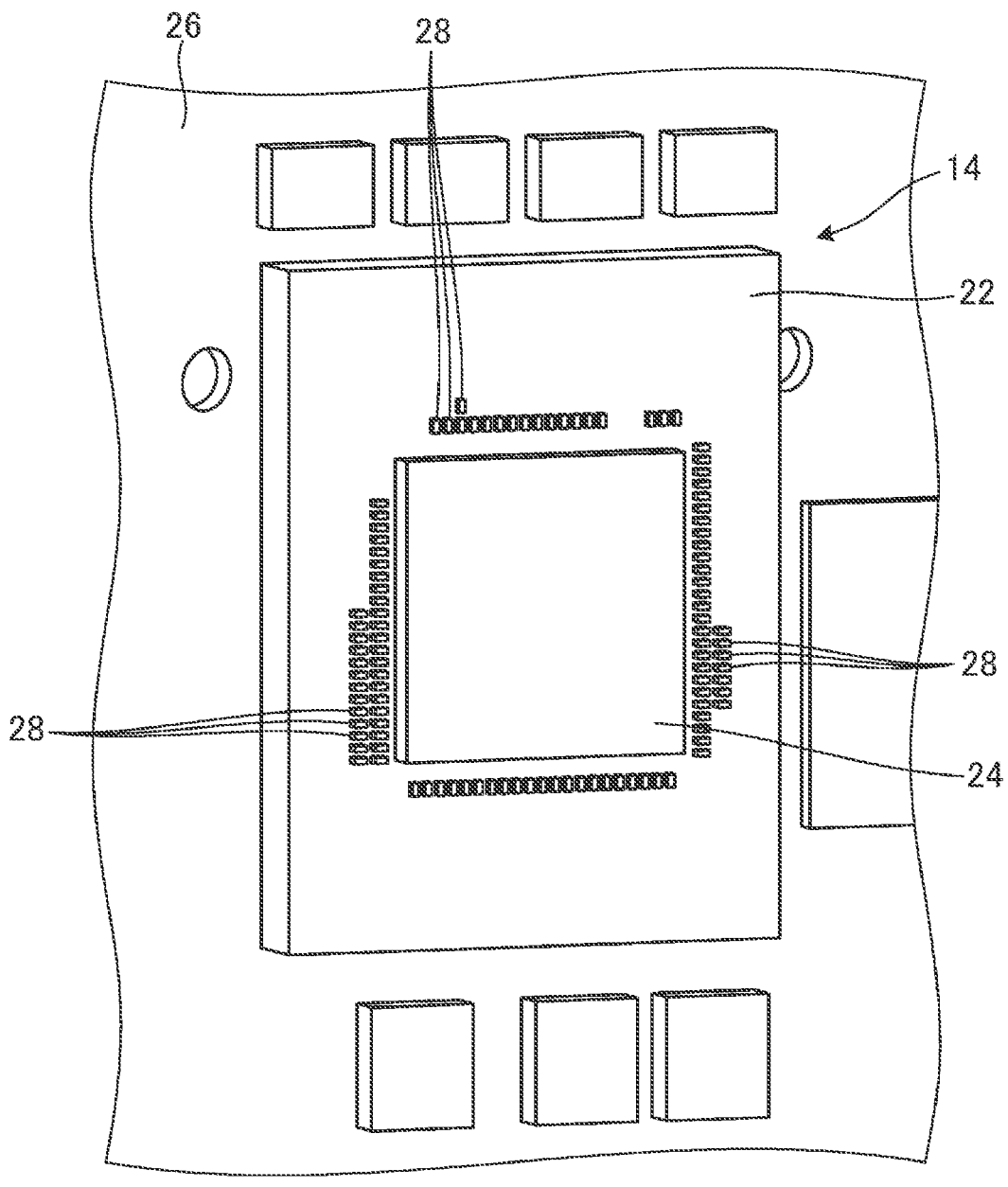
FIG. 2 is a perspective view illustrating one example of a GPU.

FIG. 2 is a perspective view illustrating one example of the GPU 14. In FIG. 2, illustration of constitutional elements of the heat radiating structure 10 is omitted. The GPU 14 has a substrate 22 and a die (an electric component) 24. The substrate 22 is a thin plate-shaped part which is mounted on a baseplate 26 and is rectangular in a planer view. The die 24 includes an arithmetic operation circuit and is so installed as to slightly protrude from an upper surface of the substrate 22. The die 24 has a rectangular shape which is smaller than the rectangular shape of the substrate 22 in a planer view and is installed on an almost central part of the upper surface of the substrate 22. The GPU 14 is one of electric components which generate heat the most in the portable information apparatus 12 and the die 24 generates heat especially among them. In other words, the die 24 is one of the electric components which generate heat the most in the portable information apparatus 12. Incidentally, the portable information apparatus 12 includes a CPU. The CPU includes a substrate and a die similar to the GPU 14 and the heat radiating structure 10 is applicable to the CPU. Further, the heat radiating structure 10 is also applicable to semiconductor chips other than the GPU 14 and the CPU and/or the heat radiating structure 10 is also applicable to heat radiation from semiconductor chips other than the GPU 14 and the CPU and/or other electric components which generate heat.

Many small capacitors 28 are so arrayed on the upper surface of the substrate 22 as to surround the die 24. The capacitors 28 are arrayed on the four sides of the die 24 in one line or two lines depending on each position. The capacitors 28 are installed comparatively in the vicinity of the die 24. The height of each capacitor 28 is lower than the height of the die 24. The capacitors 28 are covered with an insulating material 34 (see FIG. 3). The insulating material 34 is, for example, an adhesive, an ultraviolet curing type coating material or the like and is formed in membrane.

Figure 3:
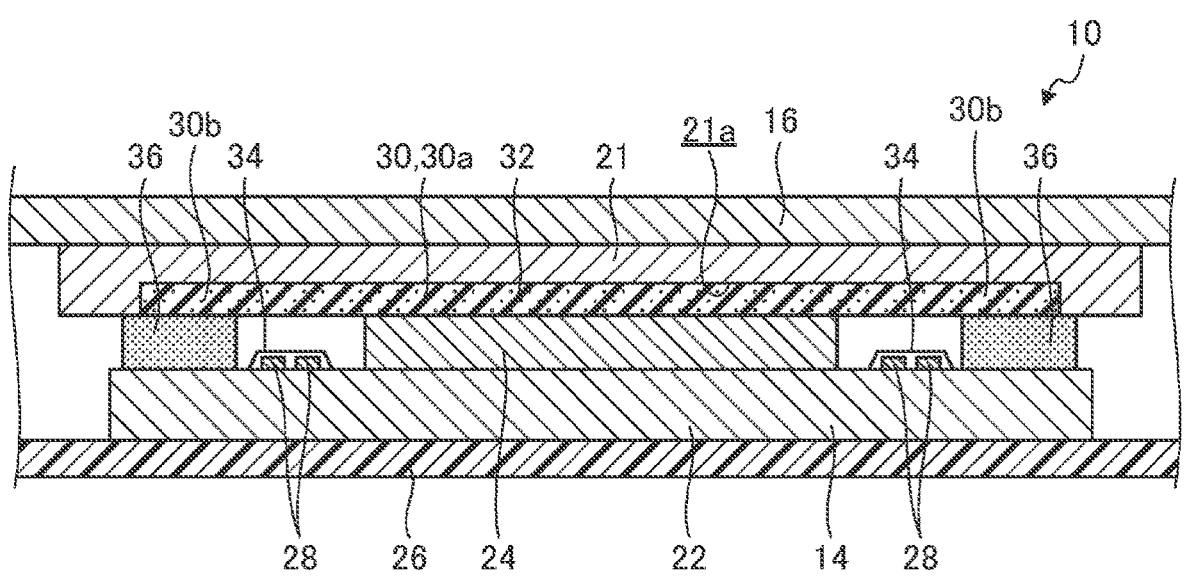
FIG. 3 is a schematic cross-sectional side view illustrating one example of the heat radiating structure according to one embodiment of the present invention.
Figure 4:
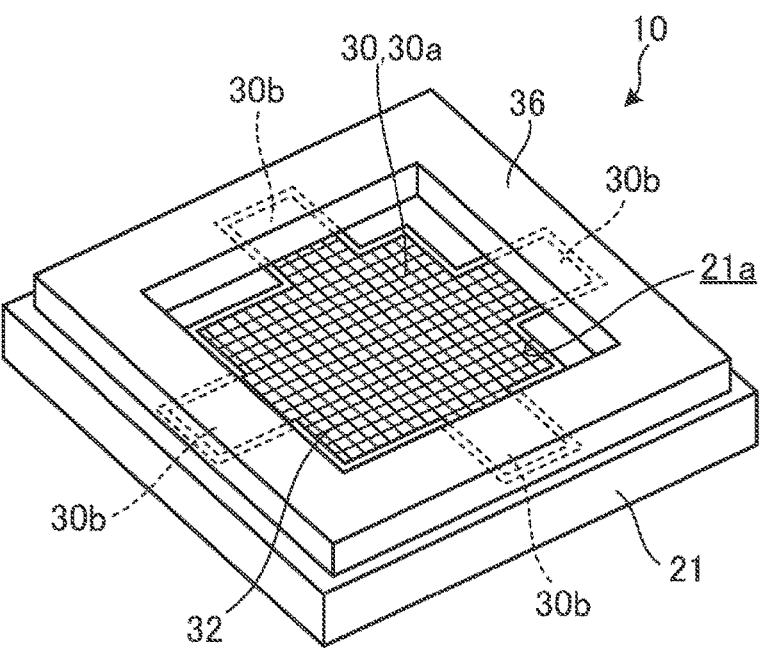
FIG. 4 is a schematic perspective view illustrating one example of a copper plate, a mesh and a sponge tape which are assembled together.
Figure 5:
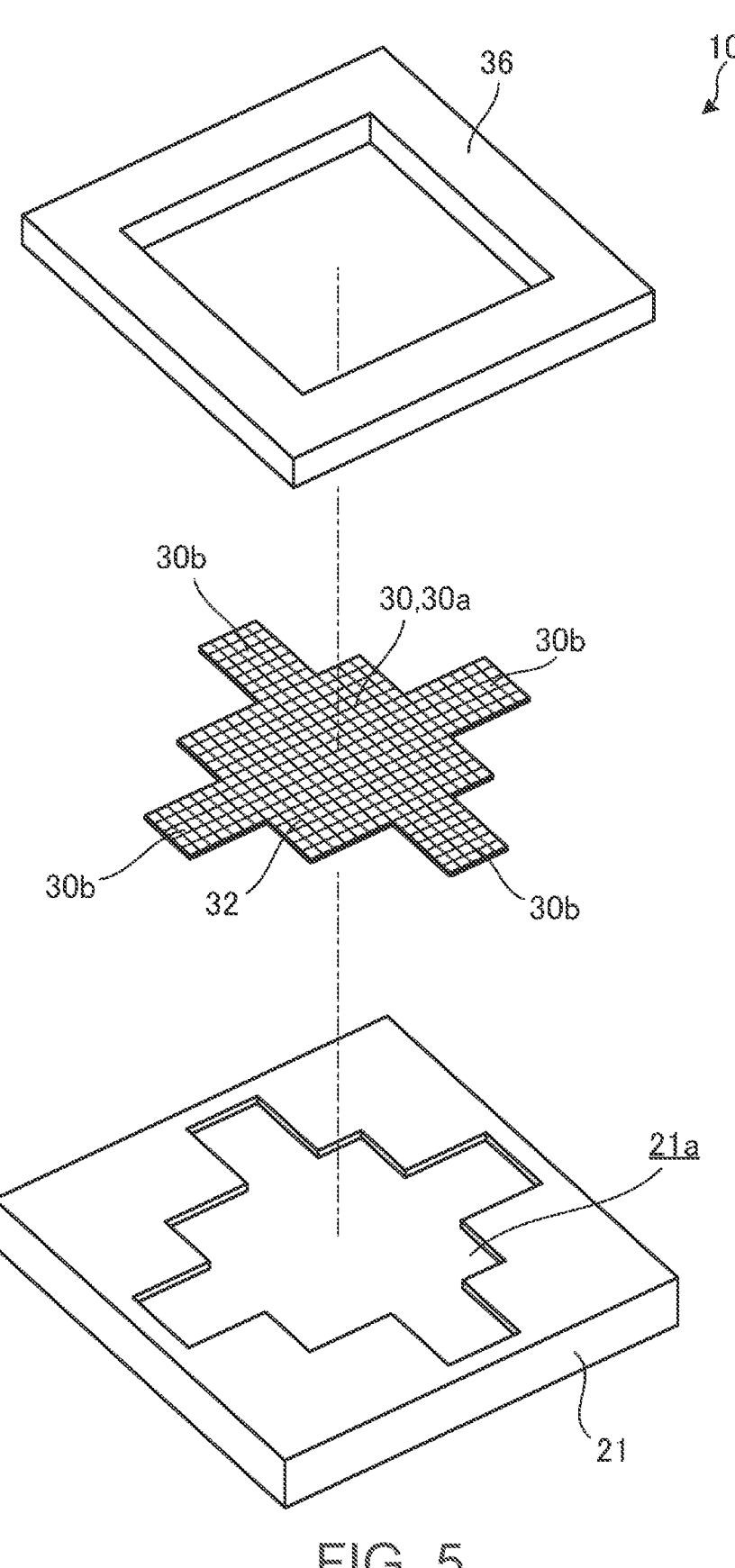
FIG. 5 is a schematic exploded perspective view illustrating one example of the copper plate, the mesh and the sponge tape.

FIG. 3 is a schematic sectional side view illustrating one example of the heat radiating structure 10 according to one embodiment of the present invention. FIG. 4 is a schematic perspective view illustrating one example of a copper plate 21, a mesh (a porous material) 30 and a sponge tape (a belt-like adhesive material) 36 which are assembled together. FIG. 5 a schematic exploded perspective view illustrating one example of the copper plate 21, the mesh 30 and the sponge tape 36. The heat radiating structure 10 includes the vapor chamber 16 and the mesh 30 which is sandwiched and held between the vapor chamber 16 and the surface of the die 24 via the copper plate 21.

The mesh 30 includes a central rectangular heat generating element abutment range part 30a and heat generating element non-abutment range parts 30b which are formed to protrude from the heat generating element abutment range part 30a in four directions in the form of a cross. The heat generating element abutment range part 30a abuts on the surface of the die 24. A liquid metal (a heat transfer fluid) 32 is impregnated into, at least, the almost entire surface of the heat generating element abutment range part 30a. The liquid metal 32 may not be impregnated into the heat generating element non-abutment range parts 30b.

Although the liquid metal 32 is basically liquefied at a normal temperature, a phase-change material or the like which is liquefied at a temperature that at least the baseplate 26 of the portable information apparatus 12 is electrically conducted and the GPU 14 operates and enters a normal use state may be also used. The liquid metal 32 is a metal and therefore is excellent in thermal conductivity and electro-conductivity. In addition, the liquid metal 32 is a liquid and therefore has fluidity.

The liquid metal 32 is impregnated into the heat generating element abutment range part 30a across the almost entire surface thereof basically, comes into contact with the surface of the die 24 and the copper plate 21 and thermally connects the both together favorably. Although the liquid metal 32 is impregnated into the heat generating element abutment range part 30a across the almost the entire surface thereof basically, there may exist a part into which the liquid metal 32 is not impregnated at an end and so forth of the heat generating element abutment range part 30a as a room for absorption of a surplus amount of the liquid metal 32 depending on a condition.

As a way of impregnation, for example, it is preferable to immerse the mesh 30 in a tank of the liquid metal 32 or to apply the liquid metal 32 to the mesh 30. Although there are also cases where it is difficult to impregnate the liquid metal 32 into the mesh 30, the mesh 30 is in a stand-alone state at a stage prior to being incorporated into the heat radiating structure 10 at this point in time and thus it is easy to handle the liquid metal 32 and, in addition, upper, lower, front, rear, left and right faces which are six faces in total are left open and therefore it is easy to impregnate the liquid metal 32 into the mesh 30. In addition, since the mesh 30 is in the stand-alone state at this point in time, it becomes possible to inspect whether the liquid metal 32 is appropriately impregnated into the mesh 30 with eyes or in a predetermined manner. In addition, in a process of assembling the heat radiating structure 10, in a case where the liquid metal 32 is applied to the surface of the die 24 and a bottom of a recessed part 21a of the copper plate 21 in advance, the liquid metal 32 which is so applied is mixed with the liquid metal 32 which is impregnated into the mesh 30 and thereby the die 24, the copper plate 21 and the mesh 30 are surely brought into thermal contact with one another.

The heat generating element abutment range part 30a is in the form of a rectangle which is the same as or is slightly larger than the rectangular surface of the die 24 and covers the surface of the die 24. Alternatively, some small holes may be formed in the heat generating element abutment range part 30a in accordance with a heat generation distribution and so forth of the die 24 and thereby the holes may be used as liquid receivers of the liquid metal 32.

The heat generating element non-abutment region parts are formed in a state of being contiguous to the heat generating element abutment region part 30a and protrude across a width which is the same as the width of a sponge tape 36 which will be described or across a width which is somewhat wider than the width of the sponge tape 36. The heat generating element non-abutment range part 30b does not abut on the surface of the die 24.

As the mesh 30, the one that a wire is woven, the one that many holes are formed in a plate material by etching and so forth are applicable. Although the mesh 30 may be made of a resin material and so forth, in a case where the mesh 30 is made of a metal material, it becomes possible to obtain a favorable heat transfer performance. In a case where the mesh 30 is formed by using the metal material such as a copper material, an aluminum material and so forth, the mesh 30 which is plated with a nickel material (an alloy which contains nickel as the main ingredient is included) may be preferably used. That is, it becomes possible to prevent the mesh 30 from being deteriorated with the liquid metal 32 by plating at least the surface of the mesh 30 with the nickel material. It becomes possible to omit execution of plate processing by configuring the mesh 30 by using the nickel material. In addition, it becomes possible to obtain favorable heat transmissibility by plating the copper material and the aluminum material with nickel.

The mesh 30 may be replaced with another porous material into which impregnation of the liquid metal 32 is possible, for example, a foaming body such as a sponge and so forth. In the present patent application, the porous material shall indicate a material of a quality which makes it possible to impregnate a heat transfer fluid such as the liquid metal 32 and so forth regardless of whether the material is made of a metal, a resin or the like. The sponge which is used as the porous material may be either a resin sponge or a metal sponge (just like a metal scrubbing brush). In addition, in the present patent application, the porous material may be either an elastic body or a rigid body.

The copper plate 21 is larger than the mesh 30 both in lengthwise and crosswise sizes and a recessed part 21a into which the mesh 30 fits is formed in a central part of the copper plate 21. The recessed part 20a is so formed as to have a shape which is almost the same as the shape of the mesh 30 such that the mesh 30 fits into the recessed part 21a exactly. However, for reason of convenience or the like of a work of fitting the mesh 30 into the recessed part 21a, the recessed part 21a and the mesh 30 may be somewhat different from each other in size and shape. A depth of the recessed part 21a is almost equal to the thickness of the mesh 30. In the copper plate 21, it is preferable to plate at least the inside of the recessed part 21a with nickel in advance.

Although the sponge tape 36 has a thickness of a certain extent differently from sheet-shaped adhesive tapes 38 and 48 which will be described later, it is possible to regard the sponge tape 36 as a belt-shaped adhesive material. That is, the sponge tape 36 is a sponge-like belt-shaped adhesive material. The sponge tape 36 is in the form of a frame and the four sides of the sponge tape 36 are affixed to the copper plate 21 across four heat generating element non-abutment range parts 30*b* respectively. Thereby, the mesh 30 is fixed to the copper plate 21. Although the sponge tape 36 is adhered to the copper plate 21 and the heat generating element non-abutment range parts 30*b*, it is sufficient that the sponge tape 36 be adhered to at least the copper plate 21. The sponge tape 36 fills a gap between the copper plate 21 and the substrate 22 around the die 24.

Although, basically, the vapor chamber 16 is installed along the surface of the die 24 in parallel with the die 24, it is sufficient that the vapor chamber 16 be so installed as to abut on the entire surface of the copper plate 21 and it is also sufficient that the vapor chamber 16 be installed in slightly non-parallel (almost parallel) with the die 24 in accordance with slight elastic deformation and unevenness of the thicknesses of the mesh 30 and the copper plate 21. In addition, although the liquid metal 32 is impregnated into the mesh 30 and therefore a layer of the liquid metal alone is not illustrated in FIG. 3, the layer of the liquid metal 32 may exist between the die 24 and the mesh 30 and/or between the die 24 and the vapor chamber 16 microscopically.

In the heat radiating structure 10 and the portable information apparatus 12 which are configured in this way, since the die 24 and the vapor chamber 16 are thermally connected with each other with the aid of the liquid metal 32 which is impregnated into the mesh 30 via the copper plate 21, it becomes possible to obtain a favorable heat transfer performance. In addition, in a case where the portable information apparatus 12 is subjected to vibrations and shocks while the user is moving in a state of carrying the portable information apparatus 12 with him/her, a pressure is repetitively applied from the die 24 and the copper plate 21 to the liquid metal 32. However, although the liquid metal 32 has fluidity, the liquid metal 32 is impregnated into the mesh 30 and, therefore, a state that the liquid metal 32 is impregnated into the mesh 30 is maintained with the aid of an action of wettability and so forth of the liquid metal 32 relative to the mesh 30 and the liquid metal 32 does not leak out to the surrounding.

Accordingly, since an appropriate amount of the liquid metal 32 is retained between the die 24 and the copper plate 21, it becomes possible to prevent the heat transfer performance from being degraded. In addition, the liquid metal 32 is prevented from coming into contact with the capacitor 28 and other electric components which are mounted on the baseplate 26.

Although the liquid metal 32 does not come into contact with the capacitor 28 basically, the reliability is more increased by covering the capacitor 28 with the insulating material 34. In addition, although the liquid metal 26 does not come into contact with the electric components which are mounted on the baseplate 26 basically, the reliability is more increased by partitioning the four sides of the substrate 22 with the use of the sponge tape 36.

In addition, although the mesh 30 is sandwiched and held between the die 24 and the copper plate 21 at an appropriate pressure and therefore misregistration is not induced basically, since the mesh 30 fits into the recessed part 21*a* and the sponge tape 36 crosses the heat generating element non-abutment range parts 30*b* and fixes the mesh 30, it becomes possible to more prevent the misregistration of the mesh 30. Further, the mesh 30 fits into the recessed part 21*a* almost exactly and the liquid metal 32 which is impregnated into the mesh 30 does not spread to a range other than the recessed part 21*a*.

The mesh 30 is fitted into the recessed part 21*a* in a state that the liquid metal 32 is impregnated into the mesh 30 and, further, the mesh 30 is fixed with the use of the sponge tape 36. Accordingly, the liquid metal 32 is contained in the copper plate 21, a worker is allowed to handle the copper plate 21 as a detail part in an assembling process and maintenance work of the portable information apparatus 12, execution of processing such as the work of applying the liquid metal 32 becomes unnecessary and the work is facilitated.

Figure 6:
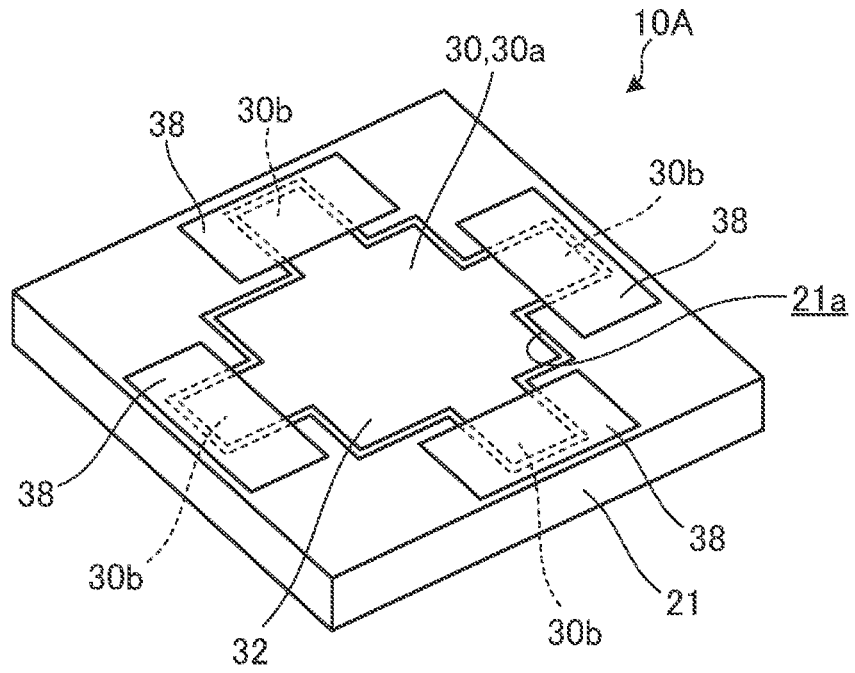
FIG. 6 is a schematic perspective view illustrating one example of a heat radiating structure pertaining to a first modified example of one embodiment of the present invention.
Figure 7:
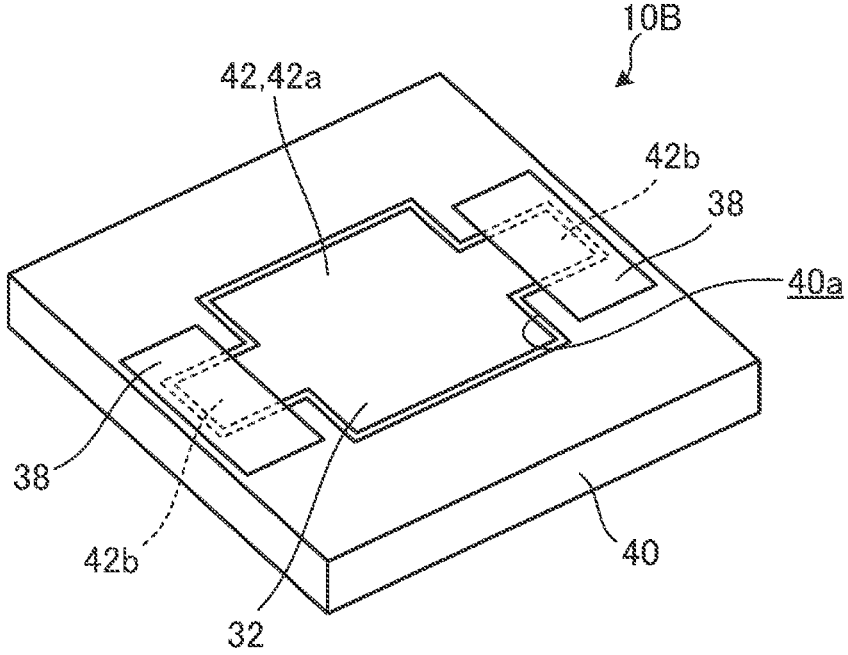
FIG. 7 is a schematic perspective view illustrating one example of a heat radiating structure pertaining to a second modified example of one embodiment of the present invention.
Figure 8:
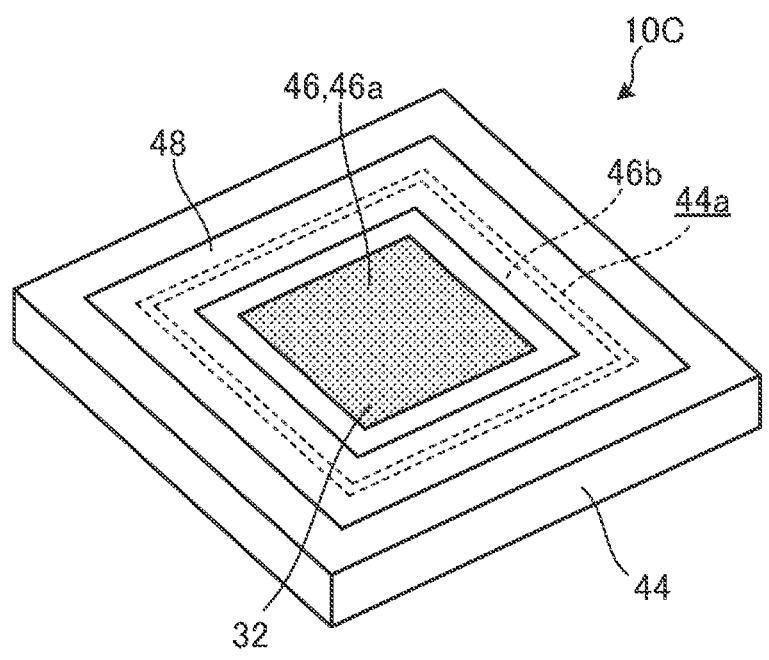
FIG. 8 is a schematic perspective view illustrating one example of a heat radiating structure pertaining to a third modified example of one embodiment of the present invention.
Figure 9:
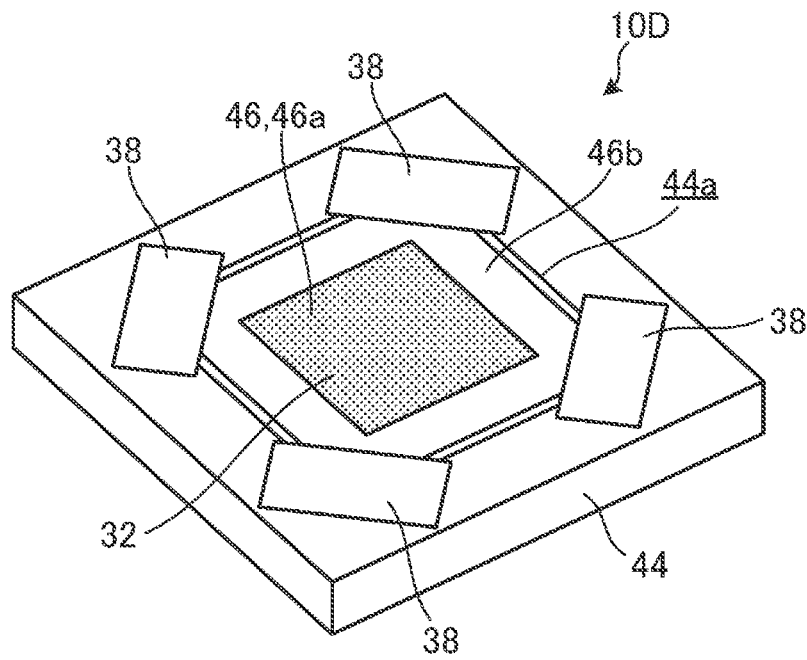
FIG. 9 is a schematic perspective view illustrating one example of a heat radiating structure pertaining to a fourth modified example of one embodiment of the present invention.

Next, modified examples of the heat radiating structure 10 will be described. FIG. 6 is a schematic perspective view illustrating one example of a heat radiating structure 10A pertaining to a first modified example. FIG. 7 is a schematic perspective view illustrating one example of a heat radiating structure 10B pertaining to a second modified example. FIG. 8 is a schematic perspective view illustrating one example of a heat radiating structure 10C pertaining to a third modified example. FIG. 9 is a schematic perspective view illustrating one example of a heat radiating structure 10D pertaining to a fourth modified example.

As illustrated in FIG. 6, the heat radiating structure 10A pertaining to the first modified example is of a type that the sponge tape 36 in the heat radiating structure 10 is replaced with four short adhesive tapes (belt-shaped adhesive materials) 38. The four adhesive tapes 38 are affixed to the copper plate 21 across the heat generating element non-abutment range parts 30*b* which are protruded respectively and thereby the mesh 30 is fixed to the copper plate 21. Also, in a case where the adhesive tapes 38 such as the above-described ones are applied, it becomes possible to preferably prevent the misregistration of the mesh 30.

As illustrated in FIG. 7, in the heat radiating structure 10B pertaining to the second modified example, a mesh 42 fits into a recessed part 40*a* which is formed in the center of a copper plate 40. The mesh 42 includes a heat generating element abutment range part 42*a* and heat generating element non-abutment range parts 42*b* which are shaped to protrude from the heat generating element abutment range part 42*a* in two directions which mutually oppose in the form of a straight line. The recessed part 40*a* has a shape which is almost the same as the shape of the mesh 42 so as to fit the mesh 42 into the recessed part 40*a*. The heat generating element abutment range part 42*a* corresponds to the heat generating element abutment range part 30*a*. Although the heat generating element non-abutment region parts 42*b* correspond to the heat generating element non-abutment parts 30*b*, these parts 40*b* and 30*b* are different from each other in number. Each heat generating element non-abutment range part 42*b* is installed such that each adhesive tape 38 is applied across each heat generating element non-abutment range part 42*b* so as to be fixed with the adhesive tape 38. Even in a case where the number of the heat generating element non-abutment range parts 42*b* is two, the mesh 42 is fixed in a stable state correspondingly. That is, in a case where the plurality of heat generating element non-abutment range parts (30*b*, 42*b*) which are shaped to protrude from the heat generating element abutment part (30*a*, 42*a*) is installed at symmetric positions, it becomes possible for the heat generating element non-abutment range parts (30*b*, 42*b*) to stably fix the mesh (30, 42).

As illustrated in FIG. 8, in the heat radiating structure 10C pertaining to the third modified example, a mesh 46 fits into a recessed part 44*a* which is formed in the center of a copper plate 44. The mesh 46 includes a heat generating element abutment range part 46*a* and a heat generating element non-abutment range part 46b. The recessed part 44a is shaped into a rectangular form which is almost the same as the form of the mesh 46 such that the mesh 46 fits into the recessed part 44a. The heat generating element abutment range part 46a corresponds to the heat generating element abutment range part 30a. In FIG. 8, the heat generating element abutment range part 46a is indicated by a dotted pattern. The heat generating element non-abutment range part 46b is so installed as to surround the heat generating element abutment range part 46a and the mesh 46 is shaped into a rectangular form. The heat generating element non-abutment range part 46b is installed such that a frame-shaped adhesive tape (a belt-shaped adhesive material) 48 surrounds the four sides of the heat generating element non-abutment range part 46b. Each of the heat generating element non-abutment range part 46b and the adhesive tape 48 may also in the form of a frame in this way. In addition, in the heat radiating structure 10C, it becomes possible to shape the mesh 46 into a simple rectangular form and thereby the structure is simplified.

As illustrated in FIG. 9, in the heat radiating structure 10D pertaining to the fourth modified example, although the copper plate 44 and the mesh 46 are applied similarly to the heat radiating structure 10C, four short adhesive tapes 38 are used in place of the frame-shaped adhesive tape 48. The four adhesive tapes 38 are affixed to the copper plate 44 across the four sides of the heat generating element non-abutment range part 46b. In the heat radiating structure 10D, it is possible to use the strip-shaped short adhesive tape 38 for fixing the mesh 46 and thereby the structure is simplified. Incidentally, in the heat radiating structures 10A to 10D pertaining to the respective modified examples, a frame-shaped or belt-shaped sponge tape may be applied in place of the adhesive tapes 38 and 48.

According to results of experiments which were performed by the inventors of the present patent application, it was found that, a phenomenon that the liquid metal 32 leaks out (although only slightly) through the gap between the die 24 and the heat sink by being induced by vibration in an existing structure is not a phenomenon which is peculiar to only the liquid metal 32 but is a phenomenon which commonly occurs in the heat transfer fluids. Accordingly, an action of preventing leakage is obtained by using a heat transfer fluid which contains a heat transfer grease as a fluid to be impregnated into the porous materials in the heat radiating structure 10 according to one embodiment of the present invention and the heat radiating structures 10A to 10D pertaining to the modified examples of one embodiment. Incidentally, the heat transfer fluid which is called in the present application is not limited to a liquid and indicates substances which have fluidity such as semisolid materials, viscous materials and so forth and includes greases, oil compounds and so forth. It is preferable to select a base material, a thickness, a micropore diameter and so forth of a porous material to be used on the basis of the viscosity, the fluidity, the wettability and so forth of the heat-transfer fluid to be impregnated. The copper plate (21, 40, 44) may be omitted and the recessed part (21a, 40a, 44a) may be formed in the vapor chamber 16 depending on each design condition. A material for holding the mesh in the recessed part may be a band-shaped adhesive material other than the sponge tape 36 and the adhesive tape (38, 48).

It goes without saying that the present invention is not limited to the above-described embodiment and it is possible to freely change the configuration within a range not deviating from the gist of the present invention.

10

The invention claimed is:

1. A heat radiating structure of an electric component which generates heat, comprising:
a porous material which abuts on a surface of the electric component; and
a heat radiating element which includes a recessed part into which the porous material fits, wherein the heat radiating element sandwiches and holds the porous material between the heat radiating element itself and the surface of the electric component, wherein
the porous material includes:
a heat generating element abutment range part into which a heat transfer fluid is impregnated and which abuts on the surface of the electric component and receives heat from the electric component, and
a heat generating element non-abutment range part which is contiguous to the heat generating element abutment range part and does not abut on the surface of the electric component, and
the heat generating element non-abutment range part is fixedly adhered to the heat radiating element with a belt-shaped adhesive material;
wherein the belt-shaped adhesive material is a sponge and fills a gap between the heat radiating element and a substrate around the electronic component.

2. The heat radiating structure according to claim 1, wherein
the heat generating element non-abutment range part protrudes from the heat generating element abutment range part and a plurality of the heat generating element non-abutment range parts is at symmetrical positions, and
the belt-shaped adhesive material crosses the heat generating element non-abutment range parts.

3. The heat radiating structure according to claim 1, further comprising:
a baseplate; and
a semiconductor chip mounted on the baseplate, wherein
the semiconductor chip includes the substrate and a die and
the electric component is the die.

4. The heat radiating structure according to claim 1, wherein
the heat-transfer liquid is a liquid metal.

5. The heat radiating structure according to claim 1, wherein
the porous material is a mesh.

6. The heat radiating structure according to claim 1, wherein
the porous material is a metal material and at least a surface of the porous material is made of nickel.

7. An electronic apparatus which has a heat radiating structure comprising:
an electric component which generates heat;
a porous material which abuts on a surface of the electric component; and
a heat radiating element which includes a recessed part into which the porous material fits, wherein the heat radiating element sandwiches and holds the porous material between the heat radiating element itself and the surface of the electric component, wherein
the porous material includes:
a heat generating element abutment range part into which a heat transfer fluid is impregnated and which abuts on the surface of the electric component and receives heat from the electric component, and a heat generating element non-abutment range part which is contiguous to the heat generating element abutment range part and does not abut on the surface of the electric component, and the heat generating element non-abutment range part is fixedly adhered to the heat radiating element with a belt-shaped adhesive material;

wherein the belt-shaped adhesive material is a sponge and fills a gap between the heat radiating element and a substrate around the electronic component.

* * * * *